United States Patent [19]

Jordan et al.

[11] Patent Number: 4,625,260
[45] Date of Patent: Nov. 25, 1986

[54] FASTENERS FOR SURFACE MOUNTING OF PRINTED CIRCUIT BOARD COMPONENTS

[75] Inventors: William D. Jordan, Dallas; Donald L. Clemens, The Colony, both of Tex.

[73] Assignee: Thermalloy Incorporated, Dallas, Tex.

[21] Appl. No.: 644,038

[22] Filed: Aug. 24, 1984

[51] Int. Cl.$^4$ .............................................. H05K 7/20
[52] U.S. Cl. ..................................... 361/386; 29/840; 228/180.2; 403/272
[58] Field of Search ............... 361/386, 388, 400, 403; 174/16 HS, 68.5; 165/80.3, 80 B, 185, 79; 403/272, 206; 339/17 C, 275 B; 357/81; 29/840; 228/180.2, 180.1, 179, 138

[56] References Cited

U.S. PATENT DOCUMENTS

| | | | |
|---|---|---|---|
| 2,820,930 | 1/1958 | Coy et al. | 357/81 X |
| 3,522,487 | 8/1970 | Hessinger | 339/17 C X |
| 3,818,423 | 6/1974 | McDonough | 339/258 P |
| 3,893,161 | 7/1975 | Pesak, Jr. | 357/81 |
| 4,054,901 | 10/1977 | Edwards et al. | 357/81 |
| 4,147,889 | 4/1979 | Andrews et al. | 361/388 |
| 4,388,967 | 6/1983 | Breese | 165/80 B |
| 4,403,102 | 9/1983 | Jordan et al. | 174/16 HS |

FOREIGN PATENT DOCUMENTS 1153476 6/1983 Canada .............................. 361/386

OTHER PUBLICATIONS

Almquist et al, "Spring Clip Mounted Extruded Aluminum Heat Sink", IBM Tech. Disclosure Bulletin, vol. 23, No. 12, 5/1981, p. 5303, 361–386.

Koopman et al, "Solid State Expanding Alloys for Chip Thermal Connection", IBM Tech. Disclosure Bulletin, vol. 19, No. 9, 2/1977, p. 3367, 174–16HS.

Primary Examiner—A. D. Pellinen
Assistant Examiner—Morris Ginsburg
Attorney, Agent, or Firm—Kanz, Scherback & Timmons

[57] ABSTRACT

A fastener is provided for mounting a heat sink to the surface of a circuit board. The fastener includes a body having structure extending from the body for engaging the heat sink. The body further includes structure extending in a direction opposite the engaging structure for contacting the surface of the circuit board. The contacting structure includes a surface parallel to the surface of the circuit board and is coated with a solder-promoting material for surface mounting the heat sink to the circuit board.

32 Claims, 14 Drawing Figures

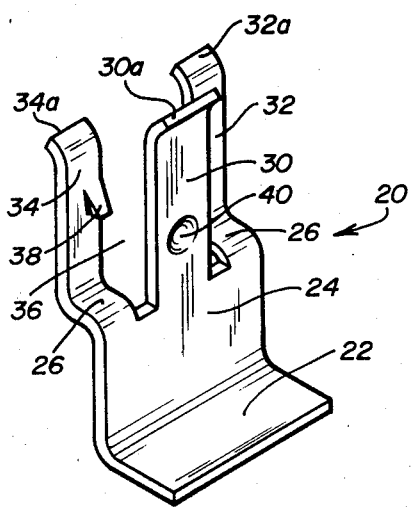
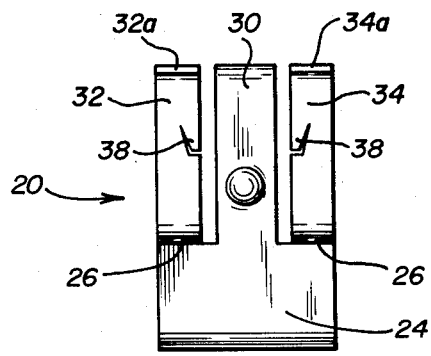
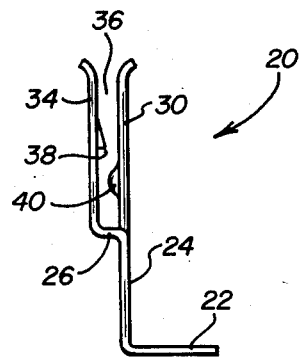
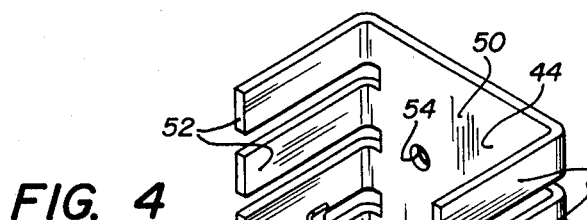
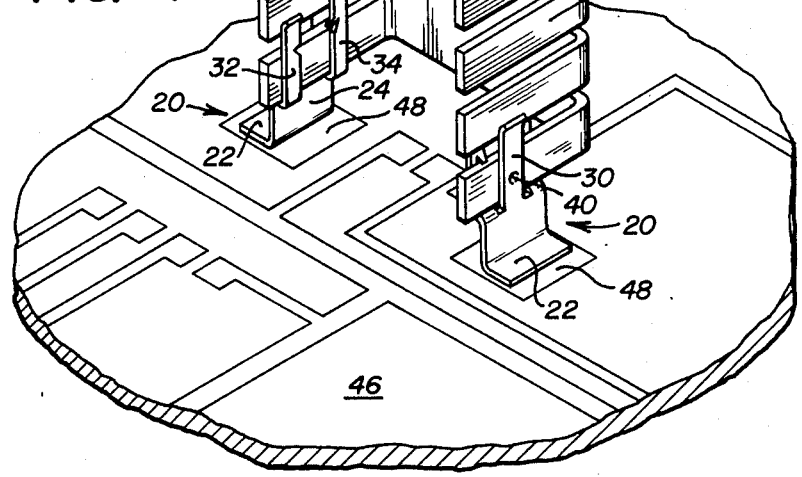
FIG. 1
FIG. 2
FIG. 3
FIG. 4

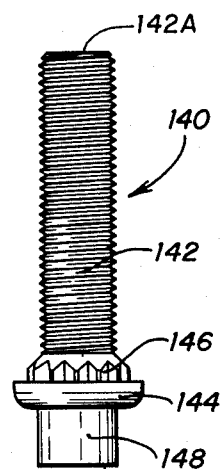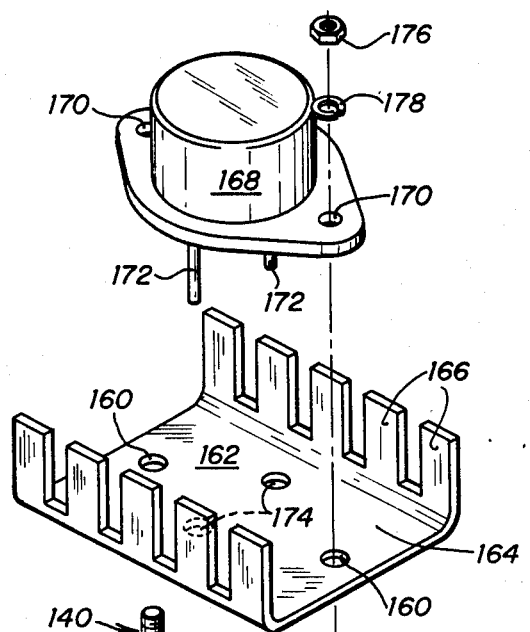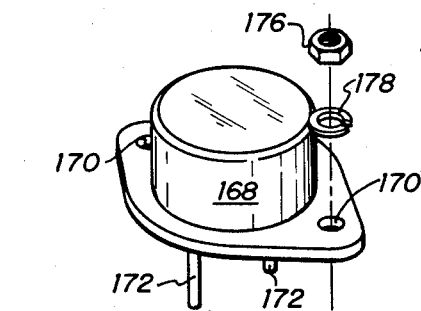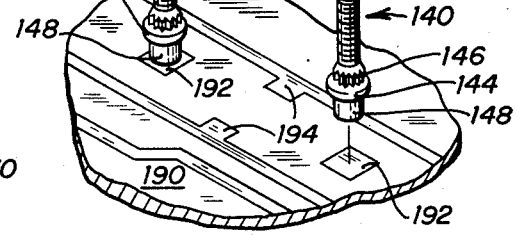
FIG. 11
FIG. 12
FIG. 13
FIG. 14

FASTENERS FOR SURFACE MOUNTING OF PRINTED CIRCUIT BOARD COMPONENTS

TECHNICAL FIELD

This invention relates to methods and apparatus for assembly of components on circuit boards and the like, and more particularly to methods and apparatus for assembly and mounting of semiconductor devices and heat sinks for semiconductor devices and the like on the surface of printed circuit boards or other mounting substrates.

BACKGROUND ART

Many semiconductor devices generate heat during operation which must be dissipated to avoid damage to the device. In some devices, the heat generated is dissipated sufficiently by the enclosure, header or leads. Other devices may be mounted on heat sinks including bodies of thermally conductive materials such as, for example, copper and aluminum which dissipate the heat generated by the semiconductor devices into the surrounding environment. Such heat sinks may be extruded, machined or include sheet metal bodies having heat dissipating fins.

Numerous mounting and fastening devices have been proposed for mounting heat sinks to printed circuit boards, for example, U.S. Pat. No. 4,388,967 issued to L. Breese on June 21, 1983 and entitled "Solderable Mounting Stakes For Heat Sinks"; U.S. Pat. No. 4,403,102 issued to W. Jordan, et al. on Sept. 6, 1983 and entitled "Heat Sink Mounting"; and U.S. Pat. No. 4,054,901 issued to S. Edwards, et al. on Oct. 18, 1977 and entitled "Index Mounting Unitary Heat Sink Apparatus With Apertured Base". Characteristic of these fastening devices is a structure for attaching the heat sink to a printed circuit board or attaching the combination of a semiconductor device and a heat sink to a circuit board in which the fastening device is received by holes formed through the circuit board. The fastener can then be soldered to the bottom surface of the printed circuit board in much the same way other components such as, for example, transistors, resistors and capacitors, are electrically connected to the circuit board such as, for example, wave soldering.

The fabrication of printed circuit boards as well as the assembly process of inserting components through holes in the circuit boards is a costly and time consuming process. It has been proposed that by eliminating the hole mounting requirements for components on printed circuit boards there can be a great reduction in the cost of such printed circuit boards, eliminating hole fabrication and drilling, as well as the labor required to insert components thereon. The surface mounting of components therefore has distinct advantages over present mounting techniques in which the components are inserted through the circuit board for subsequent soldering operations.

The surface mounting of electrical components on printed circuit boards necessitates that heat dissipating devices also be directly mounted to the surface of the printed circuit board to thereby eliminate the need for any mounting holes in the circuit board. A need has thus arisen for surface mounting fastener devices to accommodate the numerous heat dissipating devices used with semiconductor devices.

DISCLOSURE OF THE INVENTION

In accordance with the present invention, fasteners are provided for the surface mounting of heat dissipating devices to the surface of printed circuit boards.

In accordance with the present invention, a fastener is provided for mounting a heat sink to the surface of a circuit board. The fastener includes a body. Structure extends from the body for engaging the heat sink. Additional structure extends from the body in the opposite direction from the first structure for contacting the surface of the circuit board. The additional structure includes a surface parallel to the surface of the circuit board and is coated with a solder promoting material.

BRIEF DESCRIPTION OF THE DRAWINGS

For a more complete understanding of the present invention and for advantages thereof, reference is now made to the following Detailed Description taken in conjunction with the accompanying Drawings in which:

FIG. 1 is a perspective view of a mounting tab fastener in accordance with the present invention;

FIG. 2 is an elevational view of the fastener shown in FIG. 1;

FIG. 3 is a side view of the fastener shown in FIG. 1;

FIG. 4 is a perspective view of the fastener shown in FIG. 1 mounting a heat dissipating device to the surface of a printed circuit board;

FIG. 11 is an elevational view of a stud fastener in accordance with the present invention;

FIG. 12 is an exploded perspective view of the fastener shown in FIG. 11 for mounting a semiconductor package and heat dissipating device to the surface of a printed circuit board;

FIG. 13 is an elevational view of an alternative embodiment of a stud fastener in accordance with the present invention; and FIG. 14 is an exploded perspective view of the fastener shown in FIG. 13 for mounting a semiconductor package and heat dissipating device to the surface of a printed circuit board.

DETAILED DESCRIPTION

Figure 5:
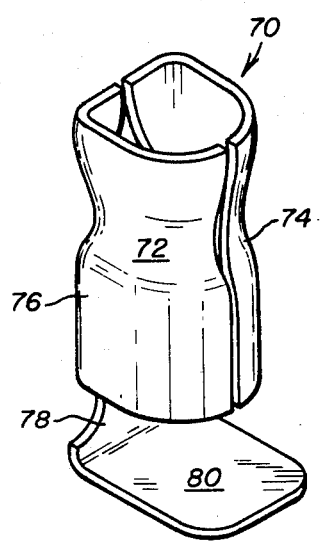
FIG. 5 is a perspective view of a contact fastener in accordance with the present invention.

Referring simultaneously to FIGS. 1-3, a mounting tab fastener in accordance with the present invention is illustrated and is generally identified by the numeral 20. Mounting tab fastener 20 comprises a unitary body of material formed from a generally flat metal blank. The flat metal blank is formed to define a support member 22 extending generally perpendicular to a vertical member 24 and a base member 26. Base member 26 is supported by vertical member 24 and lies in a plane parallel to support member 22. Base member 26 and support member 22 lie on opposite sides of vertical member 24. Parallel cuts are formed in the end of the metal blank opposite vertical member 24 to form a plurality of fingers 30, 32 and 34. Two cuts are formed in the metal blank to define the central finger 30 and two outer fingers 32 and 34.

Outer fingers 32 and 34 are folded approximately 90 degrees from vertical member 24 thereby forming base member 26. The portions of outer fingers 32 and 34 extending past base member 26 are folded approximately 90 degrees from base member 26 parallel with and spaced from central finger 30. Thus the fingers 30, 32 and 34 and base member 26 define a channel 36 adapted to receive the edge of a fin of a suitable heat sink. The width of base member 26, which determines the width of channel 36, may be varied as required to match the thickness of the heat sink to which mounting tab fastener 20 is to be attached. Ends 30a, 32a and 34a of fingers 30, 32 and 34, respectively, may be flared or curved outwardly from channel 36 to aid insertion of the heat sink therebetween.

One or more fingers 30, 32 and 34 may further include diagonal cuts formed therein to define barbs 38 extending from fingers 30, 32 and 34 into channel 36. Barbs 38 or other retaining structure engage the heat sink and aid in retaining the heat sink body rigidly and securely fixed within channel 36. Similarly, detents or dimples 40 may be formed in one or more of fingers 30, 32 or 34 to engage depressions, slots or the like formed in the heat sink to alternatively or further aid in rigidly securing the heat sink within channel 36.

Mounting tab fastener 20 may be formed by conventional metal forming techniques from any suitable sheet or ribbon material such as aluminum alloys and steel alloys. The material should exhibit sufficient strength and resiliency to permit fingers 30, 32 and 34 to act as spring clips and firmly grasp the heat sink therebetween.

An important aspect of the present invention is that support member 22 readily accepts a solder bond. Support member 22 is clad with a solderable coating material which promotes the formation of solder bonds such as tin or a tin-lead alloy. The pre-clad material may be applied by conventional pre-tinning or by plating or the like. Such pre-clad is conventionally referred to as "pre-tin" regardless of the composition of the material or the process by which it is applied and the terms "pre-tinned", "pre-tin", "tin-plated", and "tin-coated" are used interchangably herein to refer to solderable or solder-promoting coatings regardless of the actual composition of the coating or the manner by which the coating is applied. Mounting tab fastener 20 may be pre-tinned after the unitary body is formed as described above or mounting tab fastener 20 may be formed from pre-tinned blank stock. Mounting tab fastener 20 may be formed by metal stamping using conventional spring steel and the stamped parts thereafter tin-plated.

Referring now to FIG. 4, mounting tab fastener 20 may be used in connection with a variety of conventional heat sink structures to form a solderable fastener heat sink assembly for surface mounting the heat sink to a printed circuit board. A typical assembly is illustrated in FIG. 4 wherein a heat sink 44 is fastened to a printed circuit board 46 at solder pads 48. Support members 22 of fastener 20 lie parallel to the surface of printed circuit board 46 to be soldered to solder pads 48 without the need for holes through printed circuit board 46. Heat sink 44 includes a base plate 50 with fins 52 extending from two opposite edges thereof. Base plate 50 is provided with an aperture 54 through which a bolt (not shown) or the like may be inserted to affix the thermal transfer plate of a semiconductor device package in contact with base plate 50. In order to convert the conventional heat sink illustrated in FIG. 4 to a horizontally mounted heat sink, mounting tab fasteners 20 may be attached to fins 52 on heat sink 50. The pair of mounting tab fasteners may be attached to an intermediate set of fins on the heat sink or, alternatively, four or more mounting tab fasteners may be provided and mounted on the surface of the circuit board in order to support the heat sink in a horizontal position. In the latter case, the mounting tab fasteners are preferably attached to the fins on each corner of the heat sink for increased stability. It will be appreciated that mounting tab fasteners 20 may be mounted at any desired location on the fins 52 or the lower edge of base plate 50 so that support members 22 will extend parallel with base plate 50. Furthermore, mounting tab fasteners 20 may be attached to heat sink 44 either before or after the semiconductor device package is attached to heat sink 44.

Mounting tab fasteners 20 are attached to heat sink 44 by simply inserting the edges of fins 52 into channel 36 between fingers 30, 32 and 34. The width of base member 26 is coincident with the thickness of fins 52 so that fins 52 are snugly nested within channel 36 formed by fingers 30, 32 and 34. Barbs 38 extend inwardly from outer fingers 32 and 34 to engage the top edge of fins 52 when fin 52 is fully inserted into channel 36, thereby locking fin 52 within channel 36. A depression, slot or the like (not shown) may be formed in fin 52 to mate with the dimple 40 to further aid in securing fin 52 within channel 36. The entire assembly, including heat sink 44, the semiconductor package and mounting tab fasteners 20 may be mounted on printed circuit board 46 by simply soldering support members 22 to solder pads 48. Since support member 22 is pre-tin, the entire assembly may be physically and electrically connected to printed circuit board 46 in a single operation such as, for example, by passing the assembly through a hot vaporization chamber to thereby heat the solder on solder pad 48.

Figure 6:
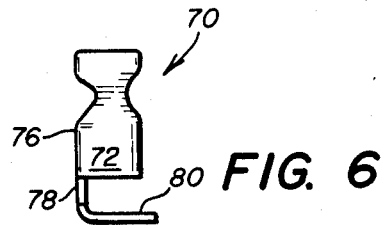
FIG. 6 is a side view of the fastener shown in FIG. 5.
Figure 7:
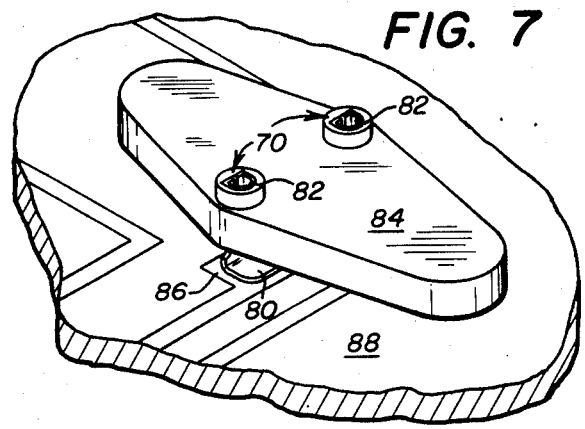
FIG. 7 is a perspective view of the fastener shown in FIG. 5 mounting a semiconductor socket to the surface of a printed circuit board.

Referring simultaneously to FIGS. 5, 6 and 7, an additional embodiment of the present invention is illustrated for use in surface mounting components to a printed circuit board. FIG. 5 illustrates a contact fastener generally identified by the numeral 70 which receives a pin of an electrical component for mounting to the surface of a printed circuit board. Contact fastener 70 may be formed from a unitary body of material formed from a generally flat metal blank which is cut to form tabs 72 and 74 which are then rolled or folded toward the central portion to form a substantially cylindrical pin or shank 76. Shank 76 is supported by a vertical member 78 which is disposed parallel to the axis of shank 76. Disposed perpendicular to vertical member 78 is a support member 80. Support member 80 is pre-tinned for mounting to the surface of a printed circuit board.

Referring specifically to FIG. 7, contact fastener 70 may be received by apertures 82 of a device 84. Device 84 may comprise, for example, a power socket for mounting a TO-3 semiconductor device to the surface of printed circuit board 88. Support member 80 lies parallel to the surface of printed circuit board 88 and is mounted to a solder pad 86. Although FIG. 7 illustrates the use of a power socket, the present contact fastener 70 may be utilized for mounting heat dissipating devices to the surface of a printed circuit board or for mounting any other type of electronic device such as a semiconductor device directly to the surface of a printed circuit board without the use of a socket or heat dissipating device. As with mounting tab fastener 20 (FIG. 1), contact fastener 70 may be pre-assembled to a heat dissipating device, socket or semiconductor device prior to soldering to printed circuit board 88 or, alternatively, contact fastener 70 may be soldered to the surface of printed circuit board 88 prior to receiving the pins of a semiconductor device. Contact fastener 70 may be formed from material similar to that of mounting tab fastener 20.

Figure 8:
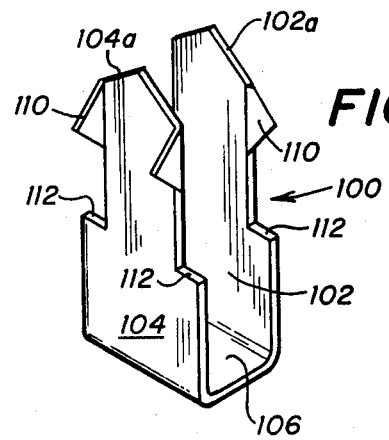
FIG. 8 is a perspective view of a clip fastener in accordance with the present invention.
Figure 9:
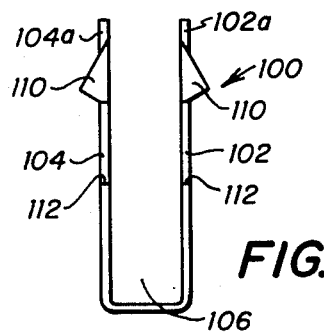
FIG. 9 is a side view of the fastener shown in FIG. 8.
Figure 10:
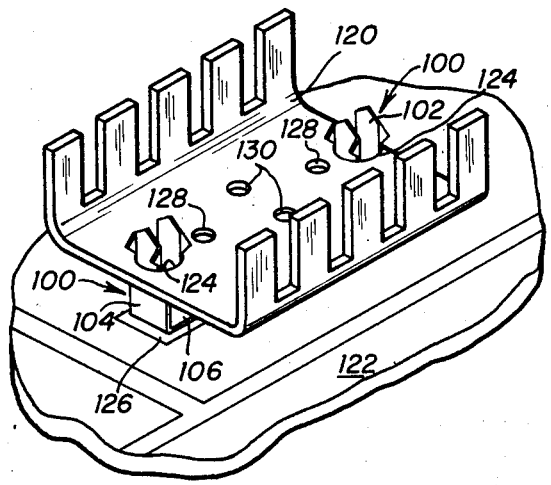
FIG. 10 is a perspective view of the fastener shown in FIG. 8 interconnecting a heat dissipating device to the surface of a printed circuit board.

Referring simultaneously to FIGS. 8, 9 and 10, a further embodiment of the present invention is illustrated and includes a clip fastener generally identified by the numeral 100. Clip fastener 100 has a generally U-shape configuration including vertical members 102 and 104 interconnected by a horizontal base member 106. Base member 106 is pre-tinned and coated with a solder-promoting material for mounting clip fastener 100 to the surface of a printed circuit board.

Vertical members 102 and 104 of clip fastener 100 include tapered ends 102a and 104a, respectively and triangular shaped barbs 110. Vertical members 102 and 104 further include a shoulder 112 for supporting the heat dissipating device.

Referring to FIG. 10, a heat dissipating device 120 is mounted to a printed circuit board 122 utilizing a pair of clip fasteners 100. Tapered ends 102a and 104a of vertical members 102 and 104 are inserted through apertures 124 of heat dissipating device 120. Barbs 110 serve as a locking device for capturing heat dissipating device 120 on shoulder 112. Base member 106 is soldered to a solder pad 126 on the surface of printed circuit board 122. A semiconductor device may be mounted to heat dissipating device 120 utilizing a bolt or other fastener through an aperture 128, the leads of which may extend to the surface of printed circuit board 122 through apertures 130.

Although clip fastener 100 has been shown in FIG. 10 for mounting a heat sink to the surface of printed circuit board 122, the present clip fastener 100 can also be used for mounting a semiconductor device package to the surface of a circuit board in those instances where no heat sink is required.

Referring simultaneously to FIGS. 11 and 12, a stud fastener of the present invention is illustrated and is generally identified by the numeral 140. Stud fastener 140 comprises an elongated cylindrical shaft 142 having a flange 144 radially extending therefrom. Shaft 142 includes ends 142a and 142b. Adjacent flange 144 and on the side thereof adjacent to end 142a, the longer end of shaft 142, is provided a slightly expanded and knurled or serrated base 146. The remainder of the longer portion of shaft 142 is threaded with standard threads to accept standard nuts or the like. Adjacent flange 144 and on the side thereof adjacent to end 142b is a head stud portion 148. The entire stud fastener 140, or at least the head stud portion 148, is tin plated to aid in forming solder connections thereof.

Referring specifically to FIG. 12, stud fastener 140 is force-fitted or swaged into a hole 160 in a base portion 162 of a heat dissipating device 164. Heat dissipating device 164 may be of various types including heat dissipating fins 166, or various other conventional heat sink bodies. Stud fastener 140 and heat dissipating device 164 may be pre-assembled by suitable machine operations, thus eliminating the hand assembly of screws, bolts and the like. A standard semiconductor device 168 is then mounted on heat dissipating device 164 with stud fastener 140 passing through mounting holes 170 and the semiconductor device leads 172 extending through holes 174 in base portion 162 of heat dissipating device 164. Nuts 176 and lock washers 178 are positioned on stud fasteners 140 and the pre-assembled semiconductor device 168 and heat dissipating device 164 are ready for soldering to a printed circuit board 190. Fastening of this assembly is accomplished by soldering head stud portion 148 to solder pads 192 on the surface of printed circuit board 190. Leads 172 can then be soldered to solder pads 194, also on the surface of printed circuit board 190.

Since the assembly of the heat dissipating device 164 and semiconductor device 168 is to be attached to printed circuit board 190 by soldering, the pre-assembled unit may be treated in exactly the same manner as any other circuit component. The components are simply positioned with their leads extending to the appropriate solder pad on the circuit board and the pre-assembled unit is positioned with the tin-plated head stud portion 148 adjacent solder pads 192. Since the head stud portion 148 of stud fastener 140 is pre-tinned, the pre-assembled unit is soldered to the printed circuit board 190 in the same soldering operation used to solder the leads of other circuit components.

It should be noted that although heat dissipating device 164 is attached to printed circuit board 190 when stud fastener 140 is soldered, the nuts 176 are on the top surface. Accordingly, semiconductor device 168 may be removed for replacement without removing heat dissipating device 164. Therefore, servicing and maintenance of printed circuit boards using stud fastener 140 is extremely convenient.

It will be observed that utilizing stud fastener 140 with head stud portion 148, heat dissipating device 164 is mounted a predetermined distance from the surface of printed circuit board 190, that distance being determined by the length of head stud portion 148. Head stud portion 148 therefore acts as a stand-off for heat dissipating device 164. In some situations it may be desirable to mount heat dissipating device 164 more closely to the surface of printed circuit board 190. In such cases, stud fastener 140 may be manufactured without a head stud portion 148 as illustrated in FIGS. 13 and 14.

Referring now to FIGS. 13 and 14, wherein like numerals are utilized for like and corresponding components previously identified with respect to FIGS. 11 and 12, a stud fastener 200 is illustrated. Stud fastener 200 does not include the head stud portion 148 of stud fastener 140 (FIG. 11) such that flange 144 is directly solderable to solder pads 192 of printed circuit board 190. Flange 144 of stud fastener 200 is tin-plated with a solder-promoting material for soldering to solder pad 192.

Stud fasteners 140 and 200 therefore provide a printed circuit board surface mounting device for simultaneously mounting a semiconductor device and heat dissipating device in a unitary assembly. Although a threaded connection has been shown in the drawings for interconnecting the semiconductor device to the heat dissipating device, other securing devices may be utilized, for example, swage clasps or the like may be employed instead of the threaded connection shown.

The fasteners of the present invention may also be attached to the surface of the printed circuit board using a thermally conductive adhesive, such as, for example, filled epoxies and anaerobics in lieu of soldering.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A fastener for mounting a heat sink to the surface of a circuit board comprising:
   a body;
   first means extending from said body for detachably engaging the heat sink;
   second means extending from said body opposite said first means for contacting the surface of the circuit board; and
   said second means including a surface parallel to the surface of the circuit board when said body is mounted thereon, and said surface being coated with a solder-promoting material.

2. The fastener of claim 1 wherein said first means includes:
   a plurality of fingers and said second means includes a support member disposed perpendicular to said body and said plurality of fingers.

3. The fastener of claim 1, wherein said first means includes:
   a shank adapted for being received by an aperture within the heat sink and said second means includes a support member disposed perpendicular to the axis of said shank.

4. The fastener of claim 1, wherein said body comprises:
   a U shaped channel member and said first means includes the vertical members of said U-shaped member adapted for engaging an aperture in the heat sink and said second means comprises the base of said U-shaped channel member interconnecting said vertical members.

5. The fastener of claim 1, wherein said body comprises:
   an elongated shaft having first and second ends, said first means comprising said first end of said elongated shaft adapted to extending through an aperture in the heat sink and said second means comprising said second end of said elongated shaft.

6. A solderable stake for a heat sink comprising:
   a body having a vertical member including first and second ends;
   a base member transverse to said vertical member first end and being supported on one side by said vertical member;
   a support member parallel to said base member and transverse to said vertical member second end for supporting said body;
   a plurality of parallel fingers extending from said base member parallel to said vertical member and being disposed at an opposite side of said base member from said vertical member with said vertical member and said fingers extending in opposite directions from said base member;
   at least one of said fingers being displaced from the other fingers to form with said base member a channel adapted to receive the heat sink; and
   a solder-promoting coating on said support member of said body.

7. The solderable stake of claim 6 wherein the ends of said fingers opposite said base member are flared outwardly from said channel.

8. The solderable stake of claim 6 wherein at least one of said fingers includes a barb extending therefrom into said channel adapted to retain a heat sink body within said channel.

9. A solderable stake for mounting a heat sink to the surface of a circuit board comprising:
   a body having a first member including first and second ends and adapted for being disposed perpendicularly to the surface of the printed circuit board when said body is mounted thereon;
   a second member transverse to said first member first end and being supported by said first member and being disposed parallel to the surface of the circuit board when said body is mounted thereon;
   a third member parallel to said second member and transverse to said first member second end and being disposed parallel to the surface of the circuit board when said body is mounted thereon and adapted for contacting the surface of the circuit board and thereby supporting the body on the circuit board;
   a plurality of fingers extending from said second member, such that said plurality of fingers and said first member extend in opposite directions from said second member;
   said plurality of fingers and said second member forming a channel adapted to receive the heat sink; and
   a solder-promoting coating on said third member.

10. A combination comprising:
    a heat sink;
    a circuit board;
    a solderable stake for mounting said heat sink to the surface of said circuit board;
    said stake comprising a first member including first and second ends and being disposed perpendicular to the surface of the circuit board;
    said stake further including a second member transverse to said first member first end and being supported by said first member and being disposed parallel to the surface of said circuit board;
    said stake further including a third member parallel to said second member and transverse to said first member second end and being disposed parallel to the surface of said circuit board for contacting the surface of the circuit board to thereby support said stake on the circuit board; and
    a solder-promoting coating on said third member for soldering said stake to the surface of said circuit board.

11. A solderable stake for a heat sink comprising:
    a body having a vertical member including first and second ends;
    a cylindrical shank extending from said vertical member first end and having an axis parallel to said vertical member;
    a support member extending from said vertical member second end and being perpendicular to said vertical member and perpendicular to said axis of said cylindrical shank; and
    a solder-promoting coating on said support member.

12. A solderable stake for mounting an device to the surface of a circuit board comprising:
    a cylindrical shank having first and second ends, said first end being adapted for insertion into an aperture in the device, said shank having an axis perpendicular to the surface of the circuit board when mounted thereon;

support means extending from said second end of said shank and being perpendicular to said axis and parallel to the surface of the circuit board when said shank is mounted thereon; and a solder-promoting coating on said support means.

13. A fastener for mounting a heat sink to the surface of a circuit board comprising:

a U-shaped channel member including a pair of parallel vertical members having top and bottom ends, said bottom ends thereof being interconnected by a perpendicularly disposed base member being parallel to the surface of the circuit board when said channel member is mounted thereon;

said top ends of said vertical members adapted for insertion into an aperture in the heat sink; and said base member including a solder-promoting coating.

14. The fastener of claim 13 wherein said vertical members top ends include means adapted for locking the fastener to the heat sink.

15. The fastener of claim 13 wherein said vertical members include shoulder means adapted for supporting the heat sink above the surface of the circuit board a predetermined amount.

16. The combination comprising:

a heat sink including a substantially flat base portion;

at least one mounting stud having parallel top and bottom surfaces and an elongated shaft with a radially enlarged flange extending radially therefrom near one end thereof defining a shaft with a longer portion on one side of said flange and a shorter portion on the opposite side of said flange, the longer portion of said shaft extending through said flat base portion of said heat sink;

said bottom surface of said stud having a solder-promoting coating; and a circuit board with said bottom surface of said stud soldered to the surface of said circuit board.

17. The combination set forth in claim 16 wherein the longer portion of said shaft is threaded.

18. The combination of claim 16 wherein the longer portion of said shaft includes an enlarged section adjacent said flange which mates with a hole in said base portion of said heat sink and secures said stud to said flat base portion.

19. The method of attaching a semiconductor case to a circuit board comprising the steps of:

attaching the semiconductor case to at least one stud passing through the semiconductor case, the stud comprising a cylindrical shaft with a radially enlarged flange extending therefrom intermediate the ends thereof, the portion of the shaft extending in a first direction from the flange passing through the semiconductor case and at least the end portion of the portion of the shaft extending in an opposite direction from the flange coated with a solder-promoting material; and soldering the end portion of the shaft extending in the opposite direction from the flange to the circuit board.

20. A combination comprising:

a heat sink including a substantially flat base portion;

at least one mounting stud comprising an elongated shaft with a radially enlarged flange extending radially therefrom near one end thereof, said shaft extending through said flat base portion of said heat sink and at least the bottom portion of said flange being coated with a solder-promoting material; and a circuit board with said bottom surface of said flange soldered to the surface of said circuit board.

21. A combination comprising:

a heat sink;

a circuit board;

a body;

first means extending from said body for detachably engaging with said heat sink;

second means extending from said body opposite said first means for contacting a surface of said circuit board; and said second means including a surface parallel to the surface of said circuit board and said surface of said second means being coated with a solder-promoting material and soldered on a surface of said circuit board.

22. A combination comprising:

a heat sink;

a circuit board;

a body having a vertical member including first and second ends, a base member transverse to said vertical member first end and being supported on one side by said vertical member, a support member parallel to said base member and transverse to said vertical member second end, said support member including a solder-producing coating and being soldered on a surface of said circuit board, a plurality of parallel fingers extending from said base member parallel to said vertical member and being disposed at an opposite side of said base member from said vertical member with said vertical member and said fingers extending in opposite directions from said base member, at least one of said fingers being displaced from the other fingers to form with said base member a channel, whereby said heat sink is received within said channel and resiliently gripped by said fingers so as to support said heat sink on said circuit board.

23. A combination comprising:

a heat sink;

a circuit board;

at least one solderable stake soldered to a surface on said circuit board and having a vertical member including first and second ends, a cylindrical shank extending from said vertical member first end and having an axis parallel to said vertical member, said shank being inserted into an aperture in said heat sink so as to secure said heat sink to a surface on said circuit board, a support member including a solder-promoting coating thereon, and extending from said vertical member second end and being perpendicular to said vertical member and said axis of said cylindrical shank and parallel to said surface of said circuit board and soldered thereto, whereby said heat sink is mounted on said circuit board.

24. A combination comprising:

a heat sink;

a circuit board;

a solderable stake for mounting the heat sink to a surface of the circuit board, said solderable stake having a cylindrical shank having first and second ends, said first end being disposed through an aperture in said heat sink, said shank having an axis perpendicular to the surface of said circuit board, support means extending from said second end of said shank and being perpendicular to said axis and parallel and in contact with the surface of the circuit board; and a solder-promoting coating on said support means, said support means being soldered to said surface of said circuit board.

25. A combination comprising:

a heat sink;

a circuit board;

a fastener for mounting said heat sink to a surface of said circuit board, said fastener having a U-shaped channel member including a pair of parallel vertical members having top and bottom ends, said bottom ends thereof being interconnected by a perpendicularly disposed base member being parallel to and in contact with said surface of said circuit board, said top ends of said vertical members being disposed through an aperture in said heat sink; and said base member including a solder-promoting coating and being soldered to said surface of said circuit board so as to support said heat sink thereon.

26. The solderable stake of claim 12 wherein the device is a heat sink.

27. The solderable stake of claim 12 wherein the device is a socket.

28. A fastener for mounting a heat sink to the surface of a circuit board comprising:

a body;

first means extending from said body for detachably engaging the heat sink;

second means extending from said body opposite said first means for contacting the surface of the circuit board; and said second means including a surface parallel to the surface of the circuit board when said body is mounted thereon, said surface being adapted for bonding to the surface of the circuit board.

29. The fastener of claim 28 wherein said first means includes:

a plurality of fingers and said second means includes a support member disposed perpendicular to said body and said plurality of fingers.

30. The fastener of claim 28, wherein said first means includes:

a shank adapted for being received by an aperture within the heat sink and said second means includes a support member disposed perpendicular to the axis of said shank.

31. The fastener of claim 28, wherein said body comprises:

a U-shaped channel member and said first means includes the vertical members of said U-shaped member adapted for engaging an aperture in the heat sink and said second means comprises the base of said U-shaped channel member interconnecting said vertical members.

32. The fastener of claim 28, wherein said body comprises:

an elongated shaft having first and second ends, said first means comprising said first end of said elongated shaft adapted for extending through an aperture in the heat sink and said second means comprising said second end of said elongated shaft.

* * * * *